US011303839B1

United States Patent
Gulbransen et al.

(10) Patent No.: US 11,303,839 B1
(45) Date of Patent: Apr. 12, 2022

(54) CODED APERTURE FOCAL PLANE ARRAY

(71) Applicant: Raytheon Company, Waltham, MA (US)

(72) Inventors: David J. Gulbransen, Fairview, TX (US); Jae H. Kyung, Redondo Beach, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 17/062,875

(22) Filed: Oct. 5, 2020

(51) Int. Cl.
  *H04N 5/378* (2011.01)
  *H04N 5/341* (2011.01)
  *H04N 5/345* (2011.01)

(52) U.S. Cl.
  CPC ............ *H04N 5/378* (2013.01); *H04N 5/345* (2013.01); *H04N 5/3415* (2013.01)

(58) Field of Classification Search
  CPC ....... H04N 5/378; H04N 5/345; H04N 5/3415
  See application file for complete search history.

(56) References Cited

U.S. PATENT DOCUMENTS

| 4,445,117 | A | 4/1984 | Gaalema et al. |
|---|---|---|---|
| 5,043,820 | A | 8/1991 | Wyles et al. |
| 5,083,016 | A | 1/1992 | Wyles et al. |
| 5,128,534 | A | 7/1992 | Wyles |
| 5,454,048 | A | 9/1995 | Davis |
| 5,737,075 | A | 4/1998 | Koch et al. |
| 6,950,495 | B2 | 9/2005 | Nelson et al. |
| 7,532,772 | B2 | 5/2009 | Brady |
| 7,586,074 | B2 | 9/2009 | Gulbransen et al. |
| 9,445,115 | B2 | 9/2016 | DeWeert et al. |
| 9,983,063 | B1 | 5/2018 | Tener et al. |
| 10,097,774 | B2 | 10/2018 | Gibbons et al. |
| 2006/0038705 | A1 | 2/2006 | Brady et al. |
| 2008/0218851 | A1* | 9/2008 | Chen ............. H04N 5/349 359/419 |
| 2016/0182848 | A1* | 6/2016 | Lim ............. H04N 5/3456 348/308 |

* cited by examiner

*Primary Examiner* — Ahmed A Berhan
(74) *Attorney, Agent, or Firm* — Daly Crowley Mofford & Durkee, LLP

(57) ABSTRACT

Methods and apparatus for a sensing system having a focal plane array having an n×m array of sensing elements and a single output pixel and a mask to select or deselect ones of the sensing elements in the array to form patterns, wherein the mask forms a part of the focal plane array.

18 Claims, 6 Drawing Sheets

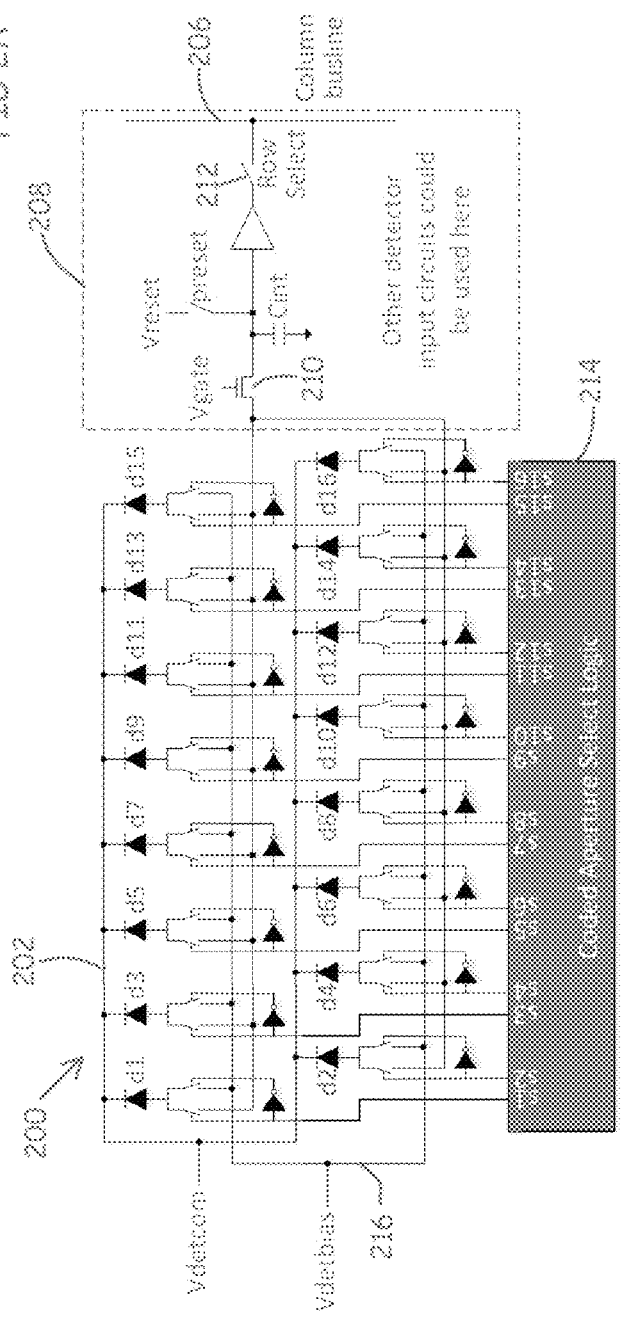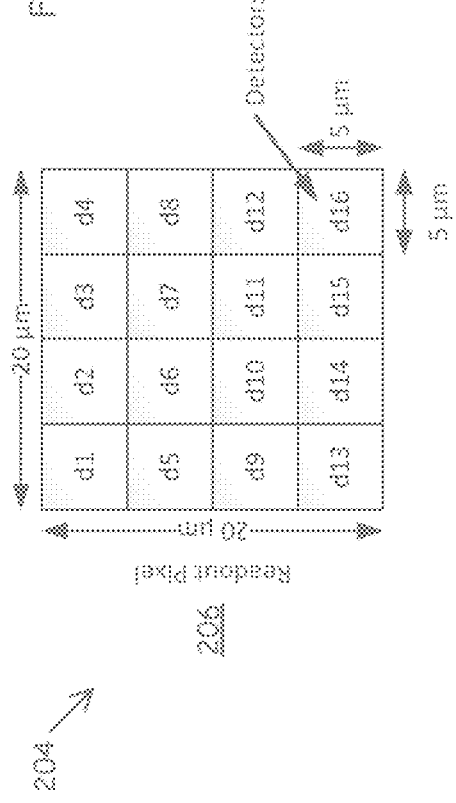

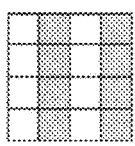 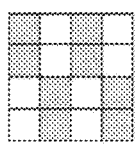 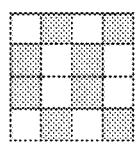 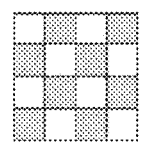
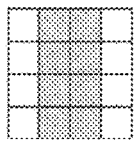 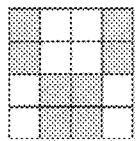 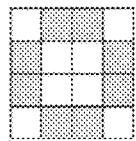 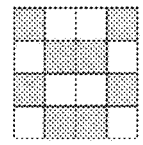
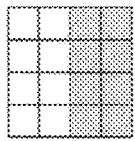 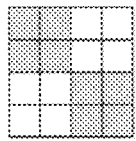 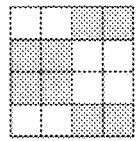 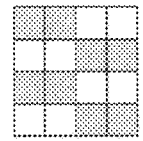
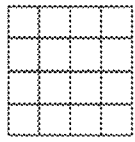 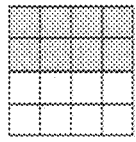 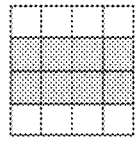 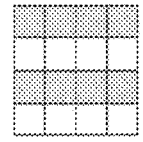
FIG. 3

CODED APERTURE FOCAL PLANE ARRAY

FIELD OF THE DISCLOSURE

The present disclosure relates to sensors, and more particularly, to sensors having a coded aperture focal plane array.

BACKGROUND

As is known in the art, various types of sensors can be used for situational awareness for vehicles, installations, aircraft, satellites, ships, and the like, for which hemispherical (2pi steradians), spherical (4pi steradians), etc., fields of view (FOVs) are useful. Conventional sensor systems can include a multitude of overlapping distributed aperture sensors each with its own large format focal plane array (FPA) or scanning or step-stare systems using smaller numbers of FPAs at the cost of reduced update rates for the full field of regard. Other systems have attempted to combine attributes to produce a relatively low resolution distributed aperture sensors to reduce the number of cameras albeit with a large instantaneous field of view (IFOV) that can be supplemented with a narrow FOV imager on an agile gimbal for interrogation and high resolution imaging. Conventional computational imaging-based systems employ signal processing techniques to enhance the resolution of smaller pixel count systems or increase the field of regard of a smaller sensor by introducing additional optical elements to create coded apertures, optical multiplexers, spatial light modulators (SLM), etc. In other known systems, to enhance resolution, pixel dithering can be used to improve spatial resolution of a non-diffraction-limited system.

SUMMARY

Embodiments of the disclosure provide methods and apparatus for a sensor system having a focal plane array for coded aperture sensing with resolution enhancement by using computational imaging techniques. In embodiments, a focal plane array (FPA) includes a detector array and a readout array bonded together. In some embodiments, a readout system includes a detector array having detectors generating outputs that are summed to a single readout pixel.

In embodiments, the readout system includes a controller to enable selection of a series of pixel aperture patterns to create coded aperture outputs that can be processed using computational imaging techniques to transform an m×m or n×m readout array into a higher resolution image, such as by a factor of 16 for a 4×4 array. In addition, embodiments of the disclosure may significantly reduce the effective data bandwidth and power dissipation of cooled focal planes, for example, as compared to conventional systems Also, coded aperture embodiments can be created within the focal plane array (FPA) without the need for complex external optical elements or physical masks to greatly simplify the optics.

In embodiments, a readout array for compressive sensing electronically applies an aperture, or in general, an encoded mask inside of the focal plane array instead of using a conventional separate movable optical element or spatial light modulator. The readout array can interface a single readout pixel to an n×m array of smaller detectors and provide a mechanism for dynamically selecting a sequence of encoded masks in real time at video rates. In embodiments, aperture mask patterns can be programmed into a readout integrated circuit (ROIC). The encoded masks can be applied in multiple regions of interest windows where enhanced resolution is desired while reading out the rest of the array at the ROIC pixel resolution. The effective resolution of the sensor can be improved through the use of computational imaging techniques. For example, a 1k×1k image sensor can approach the resolution of a 4k×4k sensor over the same field of view (for m=4). Power dissipation and data bandwidth can be reduced by a factor of $\sim m^2$ if applied over all pixels.

In one aspect, a sensing system comprises: a focal plane array having an n×m array of sensing elements and a single output pixel; and a mask to select or deselect ones of the sensing elements in the array to form patterns, wherein the mask forms a part of the focal plane array.

A system can further include one or more of the following features: a select module to control the mask select and deselections, an imager to focus light on the focal plane array, the focal plane array comprises part of a readout integrated circuit package, the mask is configured to provide Hadamard mask patterns, the select module is configured to cycle the mask through the mask patterns, n=1, the system provides a hemispherical field of view, the mask patterns are applied to a region of interest in field of view for the sensing system, and/or de-selected ones of the sensing elements are tied to a bias to shunt current.

In another aspect, a method comprises: employing a focal plane array having an n×m array of sensing elements and a single output pixel; and controlling a mask to select or deselect ones of the sensing elements in the array to form patterns, wherein the mask forms a part of the focal plane array.

A method can further include one or more of the following features: including controlling the mask with a select module to control the mask select and deselections, employing an imager to focus light on the focal plane array, focal plane array comprises part of a readout integrated circuit package, the mask provides Hadamard mask patterns, cycling the mask through the mask patterns, n=1, the system provides a hemispherical field of view, and/or applying the mask patterns to a region of interest in field of view for the sensing system.

BRIEF DESCRIPTION OF THE DRAWINGS

The foregoing features of this disclosure, as well as the disclosure itself, may be more fully understood from the following description of the drawings in which:

FIG. 2A is a schematic representation of an example ROIC implementation of a coded aperture focal plane array in accordance with example embodiments of the disclosure;

FIG. 2B is a block diagram of an example implementation of a coded aperture focal plane array readout pixel with 16 subpixel detectors in a 4×4 array in accordance with example embodiments of the disclosure;

FIG. 3 is a schematic representation of example masks for a coded aperture focal plane array in accordance with example embodiments of the disclosure;

DETAILED DESCRIPTION

Figure 1:
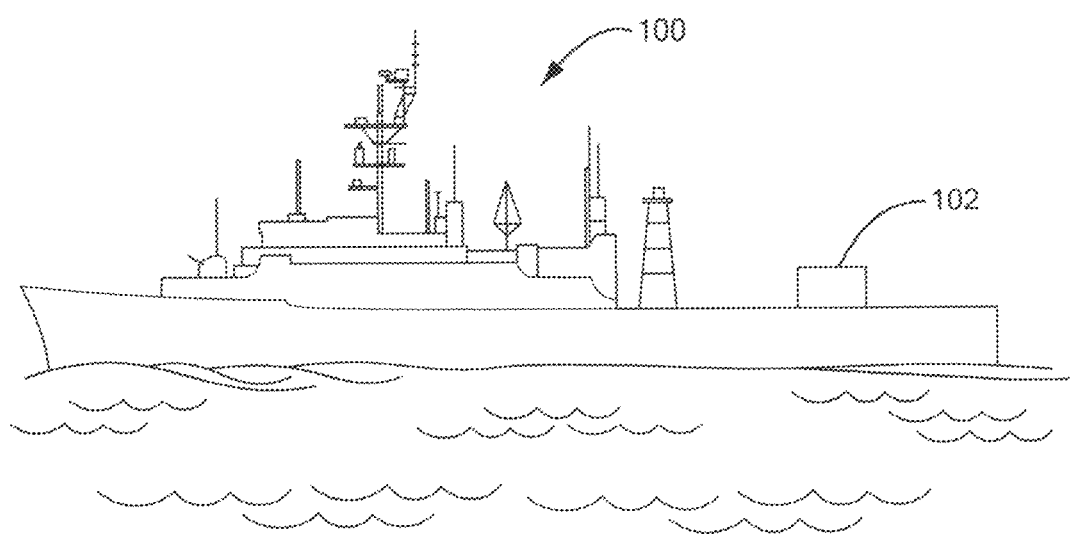
FIG. 1 is a schematic representation of an illustrative vehicle including a sensor having a coded aperture focal plane array in accordance with example embodiments of the disclosure.

FIG. 1 shows an example vehicle 100, such as a ship, including a sensor system 102 having a coded aperture focal plane array (FPA) in accordance with illustrative embodiments of the disclosure. The sensor system 102 has a field of view (FOV) that can provide some level of situational awareness (SA) for the ship. In one embodiment, the sensor system 102 provides hemispherical (2pi steradians) SA at a relatively high resolution to detect and track potential threats.

Embodiments of the sensor system are applicable to vehicles, aircraft, buildings, structures, unmanned aerial vehicles, geographical areas, and the like. In addition, any practical FOV can be provided by coded aperture FPAs to meet the needs of a particular application. In some embodiments, a portion of a FOV can be the focus of the sensor system for enhanced resolution.

FIGS. 2A and 2B show a portion of an example readout integrated circuit (ROIC) 200 having an n×m array 202 of detectors d1-d16 that outputs a single ROIC pixel 206 via a detector input circuit 208. A direct injection input buffer 210 and a row select switch 212 can be controlled to output the ROIC pixel to the column busline 206. In the illustrated embodiment, sixteen 5 μm×5 μm (n=4, m=4) detectors d1-d16 are connected to a single ROIC pixel output 206.

A readout integrated circuit (ROIC) refers to an IC for reading detectors, such as infrared and ultraviolet light sensors, for example. ROICs operate by accumulating photocurrent from each pixel and transferring the resultant signal onto output taps for readout. U.S. Pat. No. 10,097,774, which is assigned to Raytheon Company and incorporated herein by reference, discloses an example ROIC.

It is understood that any practical number or size of detectors can be used to meet the needs of a particular application. In some embodiments, n does not equal m. While in the illustrated embodiment, diode-based detectors are used, it is understood that any suitable type of detector can be used including dual or multi-color detector diodes, or avalanche photo diodes. The detector can be sensitive to any wavelength of light from ultraviolet to beyond the long wavelength infrared or sub-wavelength band in this range.

It is also understood that while the ROIC input circuit 208 shown is a direct injection (DI) type circuit other classes of detector input circuits including but not limited by a charge transimpedance amplifier (CTIA), source follower per detector (SFD), gate modulation, etc. could be used instead, such as those disclosed in U.S. Pat. Nos. 4,445,117 and 5,083,016, which are incorporated herein by reference. Further the DI circuit shown as well as the other circuits could include an in pixel sample/hold circuit or other noise reduction circuitry such as correlated double sampling. The DI circuit shown could also be a dual polarity circuit allowing a bias selectable two color detector to be used. Example DI circuits are disclosed in U.S. Pat. Nos. 5,043,820, 5,128,534, and 7,586,074, which are incorporated herein by reference.

In embodiments, each of the detectors 204 can be selected or deselected at a given time by a select module 214. In embodiments, the deselected pixels 204 are tied to a bias signal 216 to shunt their photocurrent away for reducing interference with neighboring detectors. As described more fully below, detectors 204 are selected and deselected to form desired patterns for generating outputs that can be processed in accordance with computational imaging techniques, for example. The select module 214 can be located within the ROIC pixel or could be located in the periphery of the ROIC (outside the pixel area).

FIG. 3 shows example encoded masks in which sixteen detectors are used some of which are selected and shown as unmarked, and some of which are deselected and shown as marked. While sixteen aperture masks are shown it is understood that any practical number and type of masks can be used to meet the needs of a particular application. In addition, the number of selected/deselected detectors for the masks in the sequence can vary. In the illustrated masks, except for a first mask in the upper left corner, in which all detectors are selected, half of the detectors are selected and half of the detectors are deselected. The ROIC may sequence through the masks. In some embodiments, the detector select logic 214 (FIG. 2A) for the masks is programmable. In other embodiments the select logic is hardcoded. In other embodiments, different mask patterns from those shown in FIG. 3 could be programmed into the ROIC or hardcoded into the array.

By sequencing through the masks and selecting and deselecting detectors in a known manner, information from the individual detectors can be obtained instead of just the aggregate detector information, e.g., a single output pixel with all detectors selected. The array output from each mask can be processed using computational imaging techniques, for example, to increase the resolution of the array. For example, a 24k×24k FPA can be created while "only" reading out 6k×6k pixels in any given frame. It is understood that other computational imaging techniques could be applied to exploit the mask patterns for other applications including but not limited to event detection, motion target indication, and passive depth imaging. In embodiments, the masks patterns are changed at the frame rate. In addition, coded aperture resolution enhancements can be applied to a number of smaller regions of interest in the FOV to reduce the computational bandwidth.

Figure 4:
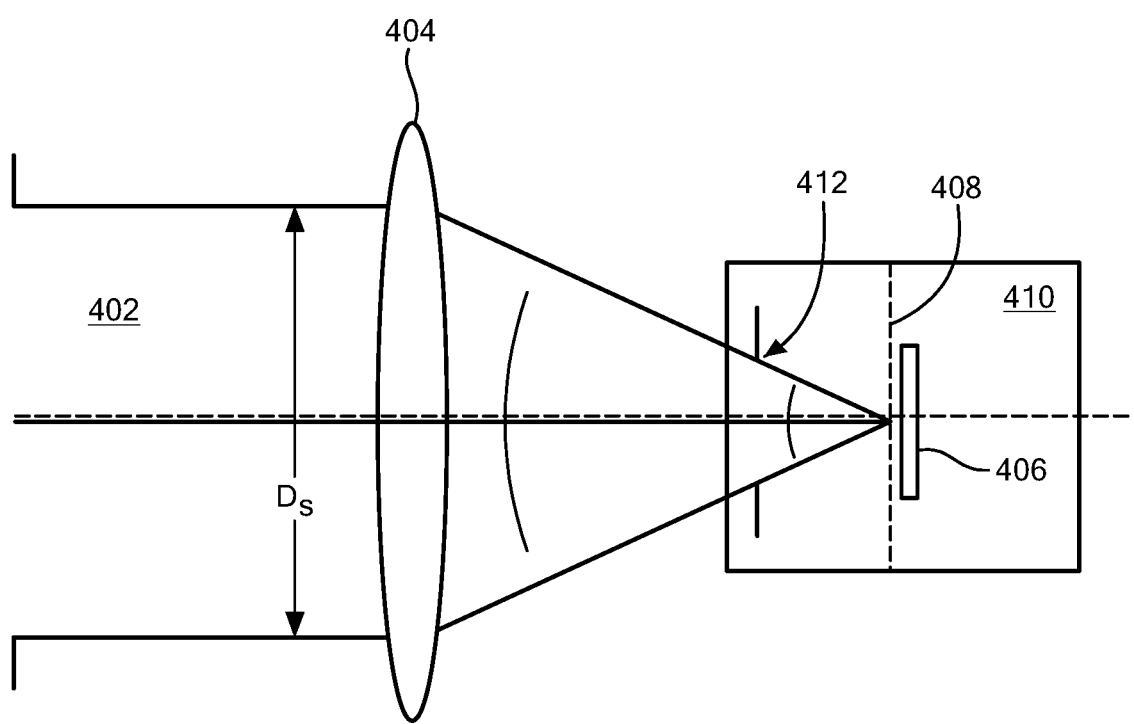
FIG. 4 is a schematic representation of example implementation system having a coded aperture focal plane array in accordance with example embodiments of the disclosure.

FIG. 4 shows an example optical imaging system 400 having a coded aperture focal plane array in accordance with example embodiments of the disclosure. An entrance pupil 402 has a diameter Ds that provides a path to an imager 404 that can include one or more lenses. The imager 404 focuses light onto a focal plane array 406. In embodiments, a mask 408, such as a Hadamard mask, is provided as part of the focal plane array 406, as described above.

In embodiments, the FPA 406 is located within an enclosure 410 that is chilled to a selected temperature in order to reduce or eliminate stray photons from impinging on the FPA and degrading accuracy of the sensor. The enclosure 410 can include a cold stop 412 at the perimeter of the controlled temperature area.

In prior art optical systems, an intermediate image must be formed between an imager and a re-imager, which focuses light onto an FPA. A mask must be located at the intermediate image. The intermediate image plane in such a system must have exquisite wave front error (WFE) quality to achieve diffraction limited performance. The optical system must be designed to minimize the wave front error (WFE) at both the intermediate image plane and the actual image plane where the FPA is located. In addition, these masks require a separate optical element distinct from the actual detector or focal plane array (FPA).

The optical system embodiments described above eliminate the need for a re-imager or intermediate image. In addition, example embodiments of the disclosure eliminate the need for a separate moveable or electrically switchable optical element, such as a spatial light modulator (SLM). The benefits of the optical system embodiments described above over conventional systems will be readily apparent to one skilled in the art.

Figure 5:
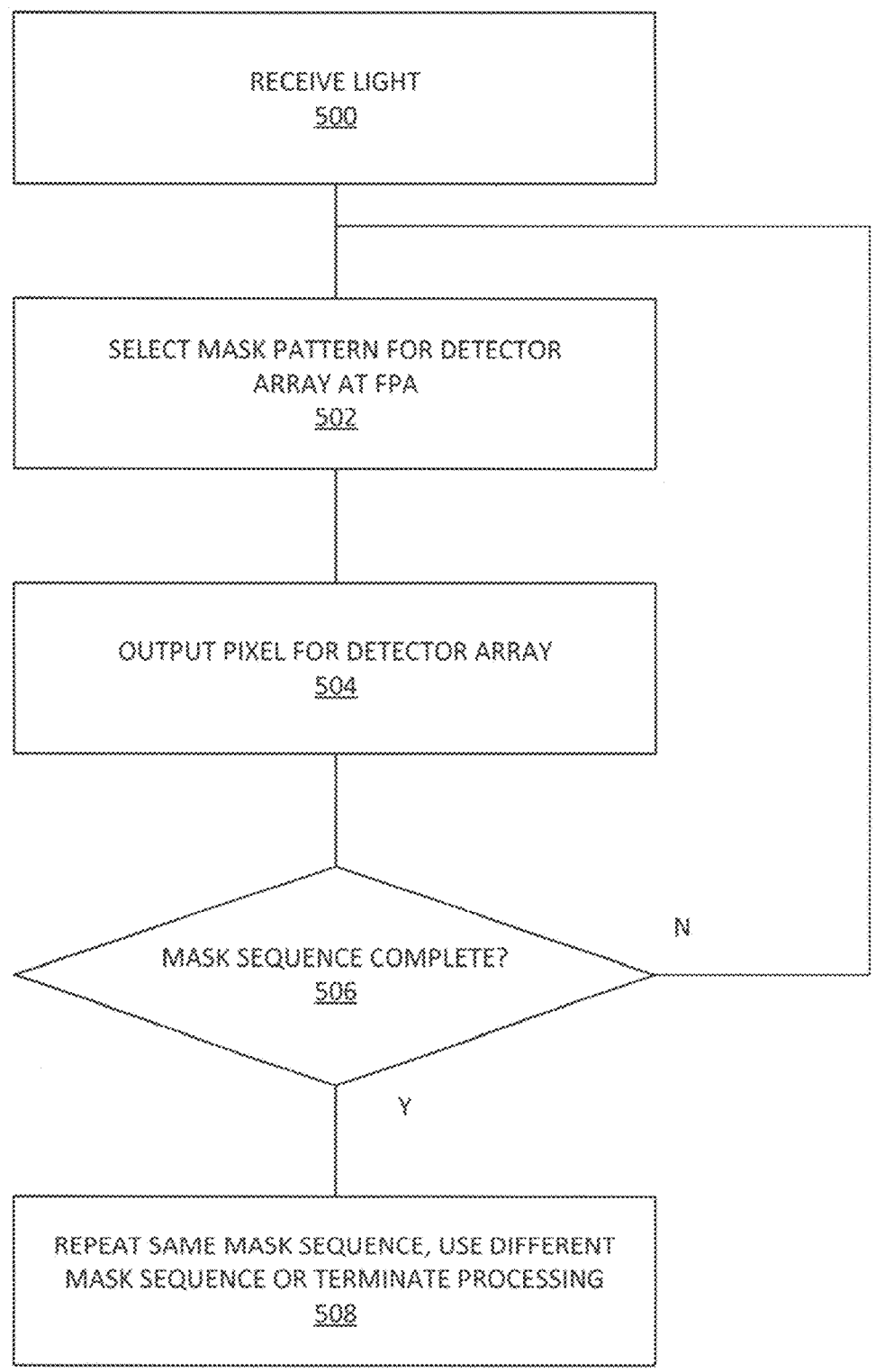
FIG. 5 is a flow diagram of an example sequence of steps for a coded aperture focal plane array in accordance with example embodiments of the disclosure.

FIG. 5 shows an example sequence of steps for a coded aperture focal plane array in accordance with example embodiments of the disclosure. In step 500, light is received at an aperture. In step 502, a mask is selected. As described above, for a given mask, certain detectors in an array are selected and certain detectors are unselected to obtain a desired mask pattern. In step 504, an output pixel can be output. In step 506, it is determined whether a mask sequence is complete. If so, processing may terminate or recycle through the mask patterns. If the mask sequence is not complete, in step 508, a different mask pattern is selected and in step 504, the output pixel can be output.

It is understood that any suitable type of mask pattern sequences can be used to reconstruct an image at the FPA. While example embodiments of the disclosure are explained in conjunction with a Hadamard mask sequence, it is understood that any practical type of mask pattern and any useful computational imaging techniques can be used to meet the needs of a particular application. Example computational processing techniques are shown and described in U.S. Pat. No. 7,532,772, U.S. Patent Publication No. 2006/0038705, U.S. Pat. Nos. 9,445,115, and 9,983,063, all of which are incorporated herein by reference.

Embodiments of the disclosure provide a sensor system having a readout array for compressive sensing that can electronically apply an encoded mask inside the focal plane array rather conventional sensors that require separate movable optical element or spatial light modulator. In embodiments, a single readout pixel can be interfaced to an m×m array of smaller detectors. The focal plane array can dynamically select a sequence of aperture masks in real time at video rates and allow arbitrary aperture mask patterns to be programmed into an ROIC. Masks can be applied in multiple region of interest windows where enhanced resolution are desired while reading out the rest of the array at the ROIC pixel resolution. Embodiments of the disclosure allow the effective resolution of the sensor to be improved by a factor of m $\geq 2$ through the use of computational imaging techniques, e.g. a 1k×1k image sensor can approach the resolution of a 4k×4k sensor over the same field of view (for m=4). In addition, sensor embodiments can reduce the power dissipation and data bandwidth by a factor of ~$m^2$ if applied over all pixels, compared with conventional sensors.

Figure 6:
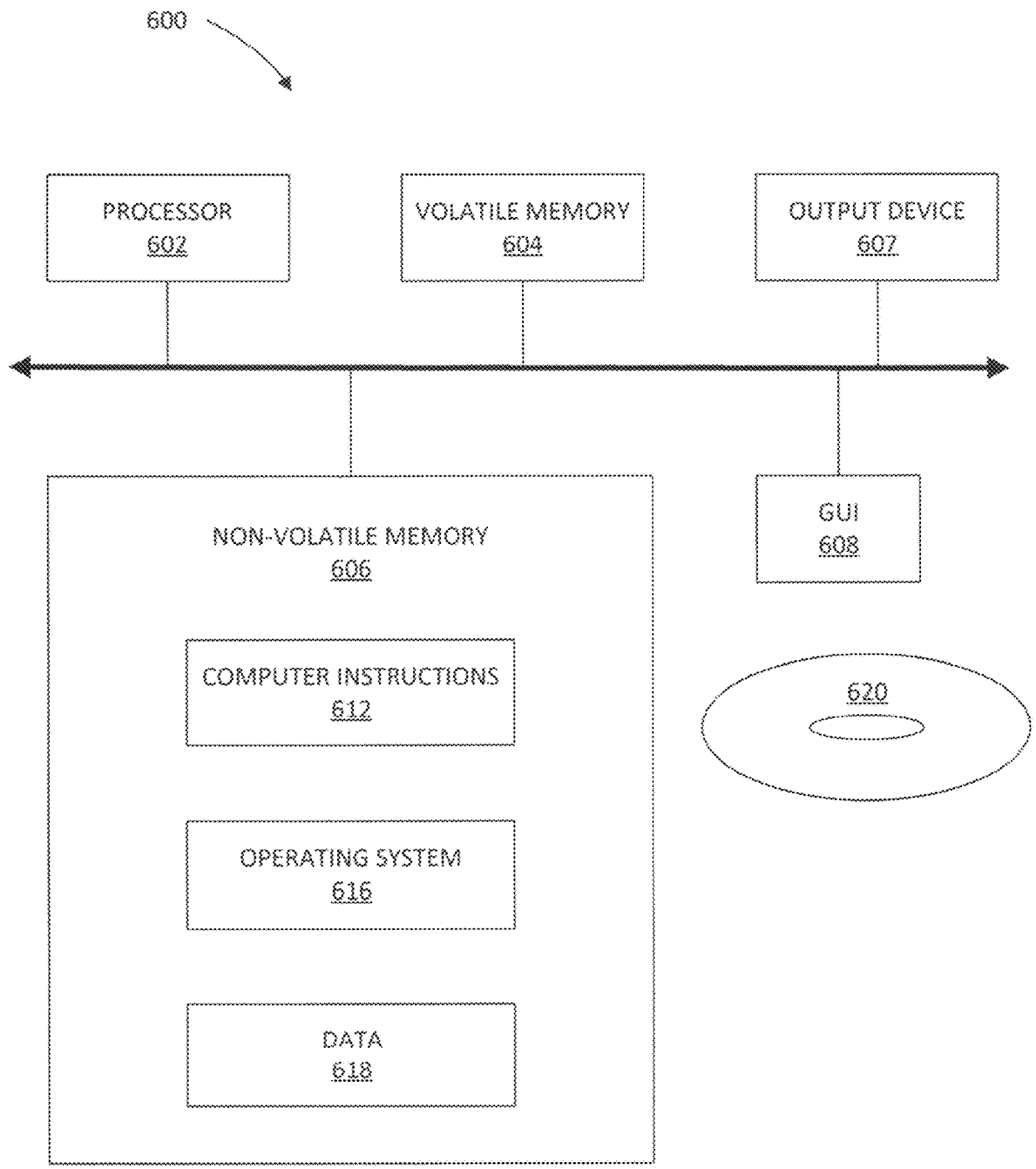
FIG. 6 is a schematic representation of an example computer that can perform at least a portion of the processing described herein.

FIG. 6 shows an exemplary computer 600 that can perform at least part of the processing described herein. For example, the computer 600 can perform processing to implement a mask controller, such as the select module 214 of FIG. 2, for example, as well as the steps in FIG. 5. The computer 600 includes a processor 602, a volatile memory 604, a non-volatile memory 606 (e.g., hard disk), an output device 607 and a graphical user interface (GUI) 608 (e.g., a mouse, a keyboard, a display, for example). The non-volatile memory 606 stores computer instructions 612, an operating system 616 and data 618. In one example, the computer instructions 612 are executed by the processor 602 out of volatile memory 604. In one embodiment, an article 620 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., RAM/ROM, CD-ROM, hard disk, or magnetic diskette) that is readable by a general or special purpose programmable computer for configuring and operating the computer when the storage medium or device is read by the computer.

Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array), a general purpose graphical processing units (GPGPU), and/or an ASIC (application-specific integrated circuit)).

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A sensing system, comprising:
    a focal plane array having an n×m array of sensing elements, wherein n and m are array element index values, and a single output pixel, wherein the focal plane array comprises part of a readout integrated circuit package;
    a mask to select or deselect ones of the sensing elements in the array to form patterns, wherein the mask forms a part of the focal plane array; and
    a select module to control the mask select and deselections.

2. The system according to claim 1, further including an imager to focus light on the focal plane array.

3. The system according to claim 1, wherein the mask is configured to provide Hadamard mask patterns.

4. The system according to claim 1, wherein the select module is configured to cycle the mask through the mask patterns.

5. The system according to claim 1, wherein n=1.

6. The system according to claim 1, wherein the system provides a hemispherical field of view.

7. The system according to claim 1, wherein the mask patterns are applied to a region of interest in field of view for the sensing system.

8. The system according to claim 1, wherein de-selected ones of the sensing elements are tied to a bias to shunt current.

9. The method according to claim 1, further including applying the mask patterns to a region of interest in field of view for the sensing system.

10. A method, comprising:
   employing a focal plane array having an n×m array of sensing elements, wherein n and m are array element index values, and a single output pixel, wherein the focal plane array comprises part of a readout integrated circuit package; and
   controlling a mask with a select module to select or deselect ones of the sensing elements in the array to form patterns, wherein the mask forms a part of the focal plane array.

11. The method according to claim 10, further including controlling the mask with a select module to control the mask select and deselections.

12. The method according to claim 10, further including employing an imager to focus light on the focal plane array.

13. The method according to claim 10, wherein focal plane array comprises part of a readout integrated circuit package.

14. The method according to claim 10, wherein the mask provides Hadamard mask patterns.

15. The method according to claim 10, further including cycling the mask through the mask patterns.

16. The method according to claim 10, wherein the system provides a hemispherical field of view.

17. The method according to claim 10, wherein n=1.

18. A sensing system, comprising:
   a means for sensing including a focal plane array having an n×m array of sensing elements, wherein n and m are array element index values, and a single output pixel, wherein the focal plane array comprises part of a readout integrated circuit package; and
   a means for selecting or deselecting ones of the sensing elements in the array to form patterns, wherein the mask forms a part of the focal plane array, wherein the means for selecting or deselecting includes a select module to control the mask select and deselections.

* * * * *